(12) United States Patent
Liu et al.

(10) Patent No.: US 11,109,518 B2
(45) Date of Patent: Aug. 31, 2021

(54) WATER-COOLED MOTOR CONTROLLER

(71) Applicant: HEFEI JEE POWER SYSTEMS Co., Ltd., Anhui (CN)

(72) Inventors: Lei Liu, Anhui (CN); Hongxin Wu, Anhui (CN); Rui Shang, Anhui (CN); Yang Yang, Anhui (CN); Yong Cheng, Anhui (CN); Jianhua Mao, Anhui (CN)

(73) Assignee: Hefei Jee Power Systems, Co., Ltd., Anhui (CN)

( * ) Notice: Subject to any disclaimer, the term of this patent is extended or adjusted under 35 U.S.C. 154(b) by 0 days.

(21) Appl. No.: 16/760,127

(22) PCT Filed: Dec. 26, 2018

(86) PCT No.: PCT/CN2018/123760
§ 371 (c)(1),
(2) Date: Apr. 29, 2020

(87) PCT Pub. No.: WO2019/205692
PCT Pub. Date: Oct. 31, 2019

(65) Prior Publication Data
US 2020/0260611 A1  Aug. 13, 2020

(30) Foreign Application Priority Data
Apr. 28, 2018 (CN) .......................... 201810400072.3

(51) Int. Cl.
*H05K 7/20* (2006.01)

(52) U.S. Cl.
CPC ......... *H05K 7/209* (2013.01); *H05K 7/20927* (2013.01)

(58) Field of Classification Search
None
See application file for complete search history.

(56) References Cited

U.S. PATENT DOCUMENTS

| 7,952,876 | B2 * | 5/2011 | Azuma | B60L 50/61 |
| | | | | 361/699 |
| 9,986,665 | B2 * | 5/2018 | Kosaka | H02M 7/537 |

(Continued)

FOREIGN PATENT DOCUMENTS

| CN | 101702572 A | 5/2010 |
| CN | 201887647 U | 6/2011 |

(Continued)

*Primary Examiner* — Courtney L Smith
(74) *Attorney, Agent, or Firm* — Craft Chu PLLC; Andrew W. Chu

(57) ABSTRACT

A water-cooled motor controller includes a capacitor, a water-cooled plate, and a power module stacked in a controller housing. The power module is fixedly connected to the water-cooled plate. The water-cooled plate is provided with a cooling medium flow channel on one side facing the power module, and the other side of the water-cooling plate on which the cooling medium flow channel faces away from the power module side contacts the capacitor through an insulating and thermally conductive material for heat exchange. The water-cooled plate and the controller housing are fixedly connected to each other with a cooling medium passage provided therebetween. A cooling medium flows in from the controller housing, and then flows out of the controller housing after being heat exchanged by the water-cooled plate. The present invention utilizes upper and lower surfaces of the water-cooled plate to dissipate heat from the capacitor and the power module simultaneously.

6 Claims, 2 Drawing Sheets

(56) References Cited

U.S. PATENT DOCUMENTS

| | | | |
|---|---|---|---|
| 10,362,703 B2* | 7/2019 | Blosch | H05K 7/20927 |
| 10,667,439 B1* | 5/2020 | Song | H02K 11/33 |
| 10,736,233 B1* | 8/2020 | Messer | H01F 27/105 |
| 2008/0174393 A1* | 7/2008 | Schnetzka | H02M 1/12 |
| | | | 336/57 |
| 2013/0009168 A1* | 1/2013 | Tsuchiya | H01L 23/473 |
| | | | 257/77 |
| 2016/0307822 A1* | 10/2016 | Usui | H01L 23/49562 |

FOREIGN PATENT DOCUMENTS

| | | |
|---|---|---|
| CN | 105584197 A | 5/2016 |
| CN | 108401405 A | 8/2018 |
| KR | 101405224 B1 | 6/2014 |

* cited by examiner

WATER-COOLED MOTOR CONTROLLER

CROSS-REFERENCE TO RELATED APPLICATIONS

See Application Data Sheet.

STATEMENT REGARDING FEDERALLY SPONSORED RESEARCH OR DEVELOPMENT

Not applicable.

THE NAMES OF PARTIES TO A JOINT RESEARCH AGREEMENT

Not applicable.

INCORPORATION-BY-REFERENCE OF MATERIAL SUBMITTED ON A COMPACT DISC OR AS A TEXT FILE VIA THE OFFICE ELECTRONIC FILING SYSTEM (EFS-WEB)

Not applicable.

STATEMENT REGARDING PRIOR DISCLOSURES BY THE INVENTOR OR A JOINT INVENTOR

Not applicable.

BACKGROUND OF THE INVENTION

1. Field of the Invention

The present invention relates to the technical field of motor controllers, and in particular to a water-cooled motor controller.

2. Description of Related Art Including Information Disclosed Under 37 CFR 1.97 and 37 CFR 1.98

Power modules inside a motor controller need heat dissipation during operation. According to the heat generated by an IGBT, air cooling or water channel cooling is usually selected to avoid damage to the power module due to excessive temperature rise and further damage to the overall motor controller.

At present, a common internal cooling solution for a controller is to arrange a capacitor and an IGBT in parallel at the bottom of the housing, and take away the heat generated during the operation of the IGBT and the capacitor through a water channel at the bottom of the housing. Alternatively, the capacitor and the IGBT are arranged in parallel at the bottom of the housing and an external fan is adopted for cold air duct cooling. Alternatively, air cooling is adopted for the capacitor and water cooling is adopted for the power module.

The first cooling method requires the cooling water channel and the controller housing to be cast into one piece. Due to the casting characteristics and the arrangement relationship between the IGBT and the capacitor, the cooling water channel can only be cast at the bottom of the controller housing. At the same time, since both the IGBT and the capacitor need to be heat dissipated, during arrangement, the IGBT and the capacitor can only be arranged in parallel, which results in that the controller's length and width are relatively large, takes up more space in the front cabin or rear axle layout of the vehicle, and is not conducive to the overall vehicle layout. The second cooling method cannot achieve stable cooling and is not suitable for situations that require a large amount of heat dissipation. The third cooling method uses different cooling methods for different components, which takes up a lot of space and is not conducive to the layout of the vehicle.

BRIEF SUMMARY OF THE INVENTION

In view of the above-mentioned shortcomings in the prior art, the present invention proposes a water-cooled motor controller, which adopts a stacked structure, and utilizes upper and lower surfaces of a water-cooled plate to dissipate heat from a capacitor and a power module simultaneously, thereby improving heat dissipation efficiency, saving space and facilitating overall vehicle layout.

The present invention is achieved by the following technical solutions:

The present invention includes a capacitor, a water-cooled plate and a power module stacked in a controller housing from bottom to top, wherein the power module is fixedly connected to the water-cooled plate, the water-cooled plate is provided with a cooling medium flow channel on one side facing the power module, and the other side of the water-cooled plate on which the cooling medium flow channel faces away from the power module contacts the capacitor through an insulating and thermally conductive material for heat exchange.

The water-cooled plate and the controller housing are fixedly connected to each other with a cooling medium passage provided therebetween, and a cooling medium flows in from the controller housing, and then flows out of the controller housing after being heat-exchanged through the water-cooled plate.

The cooling medium passage is provided with a sealing component on a contact interface between the controller housing and the water-cooled plate to prevent the cooling medium from escaping from the contact interface therebetween and short-circuiting a controller circuit.

Preferably, the seal component is an elastic seal; and more preferably, the elastic seal is an O-ring.

The water-cooled plate is fixed to the controller housing by screwing connection, which is convenient for disassembly.

The water-cooled plate is provided with a power module sealing ring corresponding to the power module which seals the power module and the water-cooled plate after the power module and the water-cooled plate are fixed to prevent the cooling medium from escaping from the contact interface therebetween and short-circuiting the controller circuit.

The power module and the water-cooled plate are fixed by screwing connection or a snap-fit structure.

The water-cooled plate is made of aluminum.

The insulating and thermally conductive material is a thermally conductive silicone pad or a thermally conductive silicone grease sheet.

The capacitor is fixed to the bottom of the controller housing by screwing connection or structural adhesive bonding.

Technical Effects

Compared with the prior art, the present invention has the following technical effects:

1) a stacked structure is adopted, and the upper and lower surfaces of the water-cooled plate is utilized to dissipate heat from the capacitor and the power module, which improves heat dissipation efficiency, so that a high-level space structure can be used, the sizes of length and width of the controller housing are reduced, and it is conducive to overall vehicle layout;

2) The controller housing does not require a die-cast water channel, the overall die casting mold is simple to process, and the controller housing has a high yield rate;

3) The water-cooled plate has a high thermal conductivity relative to the controller housing that requires a die-cast water channel, which can improve the heat dissipation efficiency and the service life of the internal devices of the controller;

4) For different power modules, the water-cooled plate is replaced synchronously, which avoids the problem of synchronously replacing the controller housing when replacing the power module in the prior art, and reduces the cost of mold opening and management of the mold.

Figure 1:
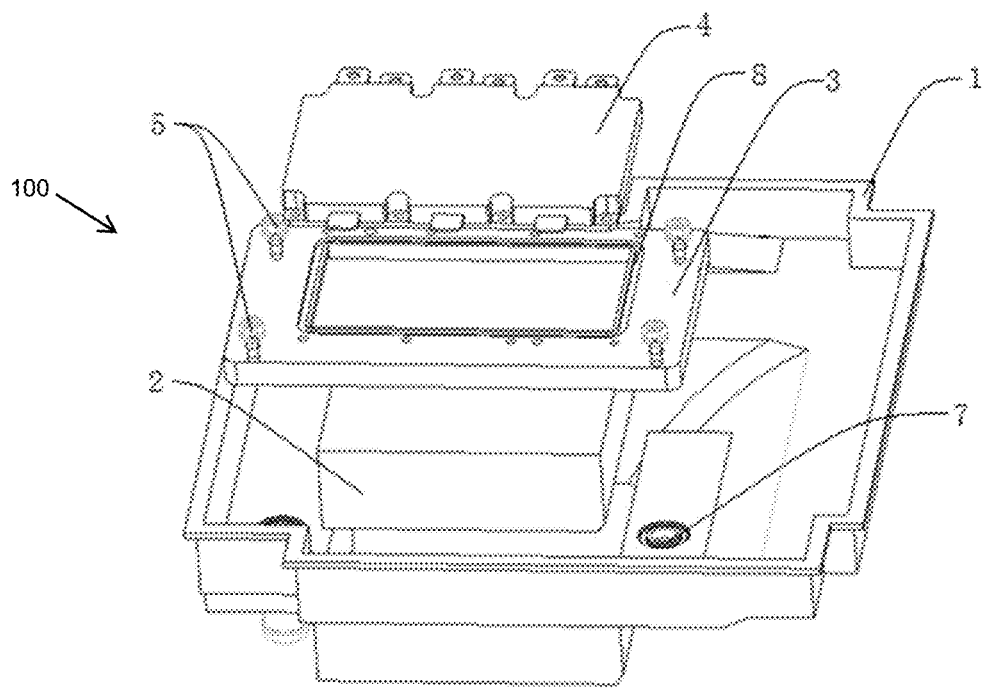
FIG. 1 is an exploded structural view of Embodiment 1.

In the figures: controller housing 1, capacitor 2, water-cooled plate 3, power module 4, fastening screws 5, insulating and thermally conductive material 6, water-cooled plate seal ring 7, power module seal ring 8, fluid inlet 9, fluid outlet 10.

DETAILED DESCRIPTION OF THE INVENTION

The present invention will be described in detail below with reference to the drawings and specific embodiments.

Embodiment 1

Figure 2:
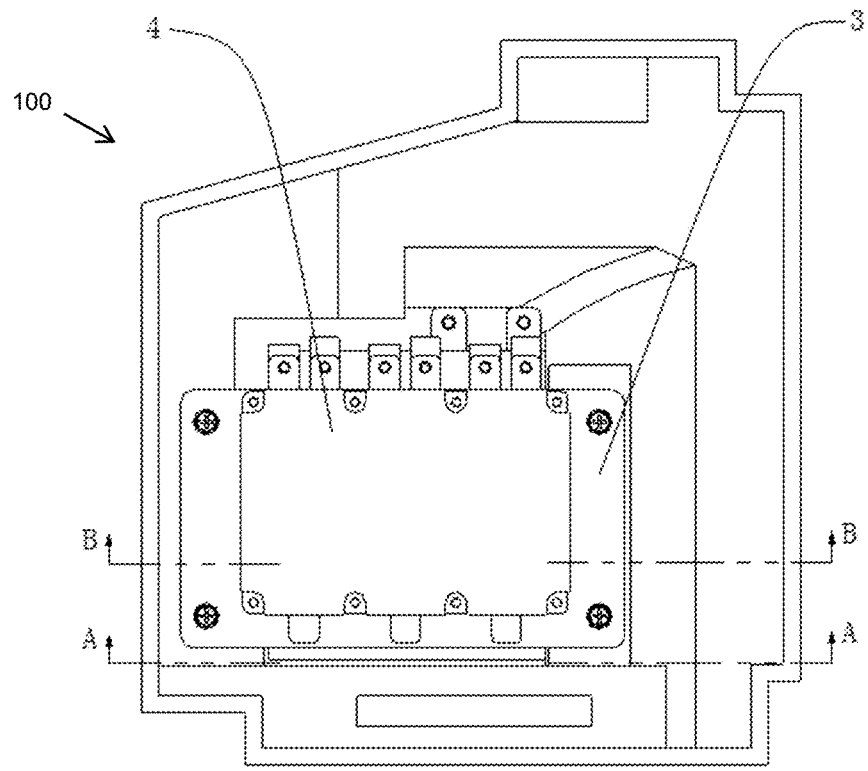
FIG. 2 is a top plan view of Embodiment 1.

As shown in FIGS. 1 and 2, this embodiment of the controller 100 includes a capacitor 2, a water-cooled plate 3, and a power module 4, which are stacked in a controller housing 1 from bottom to top. The power module 4 is fixedly connected to the water-cooled plate 3.

Figure 3:
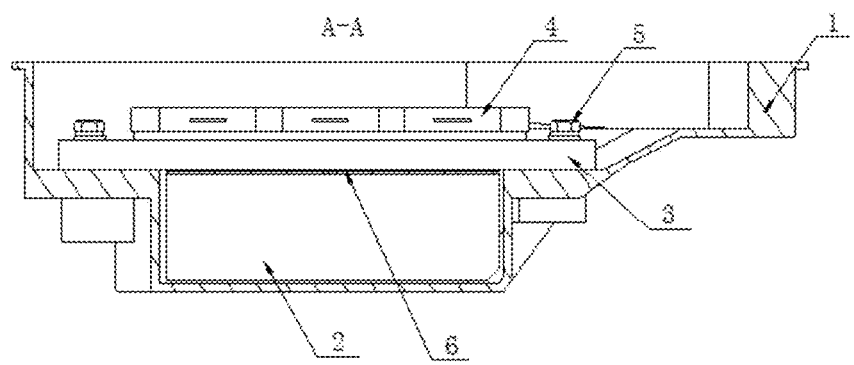
FIG. 3 is a sectional view taken along the line A-A in FIG. 2.
Figure 4:
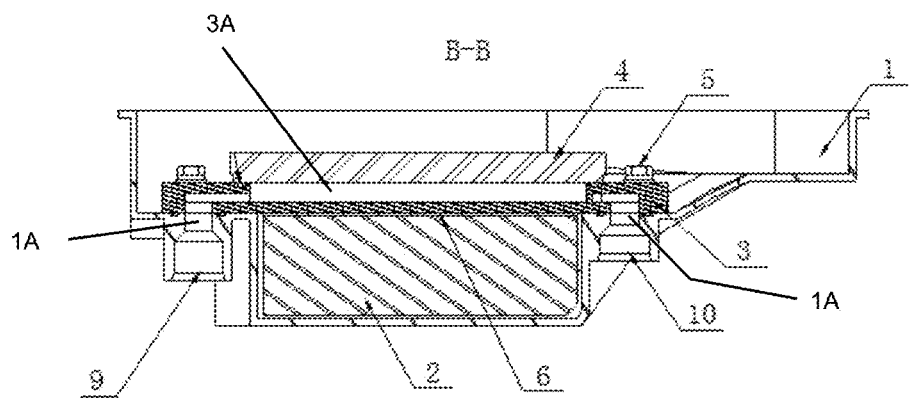
FIG. 4 is a sectional view taken along the line B-B in FIG. 2.

As shown in FIGS. 3 and 4, the water-cooled plate 3 is provided with a cooling medium flow channel. The controller housing 1 is provided with a fluid inlet 9 and a fluid outlet 10 which respectively communicate with the cooling medium flow channel on the water-cooled plate 3. A cooling medium (generally a mixture of water and ethylene glycol) flows in from the controller housing 1, and flows out of the controller housing 1 after being heat exchanged by the water-cooled plate 3.

The cooling medium flow channel 3A is disposed on one side facing the power module 4, and the other side of the water-cooling plate 3 on which the cooling medium flow channel faces away from the power module 4 contacts the capacitor 2 through an insulating and thermally conductive material 6 for heat exchange.

The fluid inlet 9 and the fluid outlet 10 are provided with a water-cooled plate seal ring 7 on a contact interface between the controller housing 1 and the water-cooled plate 3.

The water-cooling plate 3 is fixed to the controller housing 1 by fastening screws 5 and is easy to remove. This is mainly based on cost considerations. Different projects may use power modules from different manufacturers. The size of power modules from different manufacturers is significantly different. Replacing the controller housing according to the size of the power module will greatly increase the design and mold opening costs and bring management difficulties. The water-cooled plate and the power module correspond to each other. As long as the controller housing is unified and only the water-cooled plate and power module are replaced, the above problems can be solved.

The water-cooled plate 3 is provided with a power module sealing ring 8 corresponding to the power module 4 which seals the power module 4 and the water-cooled plate 3 after the power module 4 and the water-cooled plate 3 are fixed.

The power module 4 and the water-cooling plate 3 are fixed by screwing connection or a snap-fit structure.

The insulating and thermally conductive material 6 is a thermally conductive silicone pad or a thermally conductive silicone grease sheet.

The capacitor 2 is fixed to the bottom of the controller housing 1 by screwing connection or structural adhesive bonding.

In the existing solution, the cooling medium passage 1A is formed by die-casting on the controller housing 1. The material of the controller housing 1 is ADC12, and its thermal conductivity is 96. In this embodiment, the water-cooling plate 3 can be made by friction stir welding of aluminum extrusion processing. For example, aluminum material with the grade of AL6063 is used, and its thermal conductivity is 201. Compared with the prior art solution, the thermal conductivity is doubled, which is more conducive to take away the heat generated by the power module 4 and the capacitor 2 from the controller housing 1, which greatly reduces the temperature inside the controller and increases the service life of the internal devices.

It should be emphasized that the foregoing are only preferred embodiments of the present invention, and are not intended to limit the present invention in any form. Any simple amendments, equivalent changes, and modifications to the above embodiments based on the technical essence of the present invention still fall within the scope of the technical solution of the present invention.

We claim:
1. A water-cooled motor controller, comprising:
a controller housing;
a capacitor within said controller housing;
a water-cooled plate within said controller housing above said capacitor; and
a power module stacked within said controller housing above said water-cooled plate,
wherein said power module is fixedly connected to said water-cooled plate,
wherein said water-cooled plate is comprised of a side facing said power module with a cooling medium flow channel being in contact with said power module so as to flow a cooling medium in a direct heat exchange with said power module and an opposite side facing away from said power module and being in contact with said capacitor through an insulating and thermally conductive material for heat exchange,
wherein said water-cooled plate and said controller housing are fixedly connected to each other with a cooling medium passage provided therebetween so as to flow said cooling medium through said cooling medium passage in a heat exchange relationship with said water-cooled plate, wherein said cooling medium passage is provided with a sealing component on a contact interface between said controller housing and said water-cooled plate, and wherein said water-cooled plate is fixed to said controller housing through a threaded connection.

2. A water-cooled motor controller, comprising:

a controller housing;

a capacitor within said controller housing;

a water-cooled plate within said controller housing above said capacitor; and a power module stacked within said controller housing above said water-cooled plate, wherein said power module is fixedly connected to said water-cooled plate, wherein said water-cooled plate is comprised of a side facing said power module with a cooling medium flow channel and an opposite side facing away from said power module and being in contact with said capacitor through an insulating and thermally conductive material for heat exchange, wherein said water-cooled plate and said controller housing are fixedly connected to each other with a cooling medium passage provided therebetween so as to flow a cooling medium through said cooling medium passage in a heat exchange relationship with said water-cooled plate, wherein said cooling medium passage is provided with a sealing component on a contact interface between said controller housing and said water-cooled plate, and wherein said sealing component is an O-ring.

3. A water-cooled motor controller, comprising:

a controller housing;

a capacitor within said controller housing;

a water-cooled plate within said controller housing above said capacitor; and a power module stacked within said controller housing above said water-cooled plate, wherein said power module is fixedly connected to said water-cooled plate, wherein said water-cooled plate is comprised of a side facing said power module with a cooling medium flow channel and an opposite side facing away from said power module and being in contact with said capacitor through an insulating and thermally conductive material for heat exchange, wherein said water-cooled plate and said controller housing are fixedly connected to each other with a cooling medium passage provided therebetween so as to flow a cooling medium through said cooling medium passage in a heat exchange relationship with said water-cooled plate, wherein said cooling medium passage is provided with a sealing component on a contact interface between said controller housing and said water-cooled plate, and wherein said water-cooled plate is comprised of a power module sealing ring between said power module and said water-cooled plate-so as to form a removably fixed seal between said power module and said water-cooled plate.

4. The water-cooled motor controller, according to claim 3, wherein said power module and said water-cooled plate are fixed by screwing connection or a snap-fit structure.

5. The water-cooled motor controller, according to claim 1, wherein the insulating and thermally conductive material is comprised of a thermally conductive silicone pad or a thermally conductive silicone grease sheet.

6. The water-cooled motor controller, according to claim 1, wherein said capacitor is fixed to a bottom of said controller housing by screwing connection or structural adhesive bonding.

* * * * *